US011568586B2

(12) United States Patent
Hartfiel et al.

(10) Patent No.: US 11,568,586 B2
(45) Date of Patent: Jan. 31, 2023

(54) SYSTEM AND METHOD FOR TRACING POLYGONS IN DESIGN FILES

(71) Applicant: MappedIn Inc., Waterloo (CA)

(72) Inventors: Adam Hartfiel, Kitchener (CA); Erkang Wei, Waterloo (CA)

(73) Assignee: MappedIn Inc., Waterloo (CA)

( * ) Notice: Subject to any disclaimer, the term of this patent is extended or adjusted under 35 U.S.C. 154(b) by 0 days.

(21) Appl. No.: 16/883,374

(22) Filed: May 26, 2020

(65) Prior Publication Data

US 2020/0388059 A1   Dec. 10, 2020

Related U.S. Application Data

(60) Provisional application No. 62/859,251, filed on Jun. 10, 2019.

(51) Int. Cl.
*G06T 11/20* (2006.01)
*G06N 20/00* (2019.01)
(Continued)

(52) U.S. Cl.
CPC ............ *G06T 11/203* (2013.01); *G06N 20/00* (2019.01); *G06T 7/155* (2017.01); *G06T 11/60* (2013.01);
(Continued)

(58) Field of Classification Search
CPC ......... G06T 7/12; G06T 11/20; G06T 11/203; G06T 11/60; G06T 15/005; G06T 15/205; G06T 19/00; G06T 2207/10024; G06T 2207/10032; G06T 2207/10081; G06T 2207/10088; G06T 2207/10101; G06T 2207/10132; G06T 2207/20032; G06T 2207/20036; G06T 2207/20061; G06T 2207/20076; G06T 2207/20081; G06T 2207/20132; G06T 2207/20164; G06T 2207/20192; G06T 2207/30101; G06T 2207/30176; G06T 2207/30184;
(Continued)

(56) References Cited

U.S. PATENT DOCUMENTS 5,631,982 A * 5/1997 Inselberg ............. G06K 9/4633
382/168
11,074,495 B2 * 7/2021 Zadeh .................. G06K 9/3233
(Continued)

OTHER PUBLICATIONS

Morphological Image Processing, Nick Efford, Apr. 17, 2019 (Year: 2019).*

*Primary Examiner* — Ming Wu
(74) *Attorney, Agent, or Firm* — Own Innovation; James W. Hinton

(57) ABSTRACT

A system and method for tracing polygons in a drawing source file. The method includes extracting vector imagery from the source file, creating a planar representation of the vector imagery as a plurality of lines, filtering the plurality of lines to create simplified line art, morphologically dilating the simplified line art to generate a polygonal approximation, calculating geometric difference between the source file canvas bounds and the polygonal approximation to identify contracted polygons, morphologically dilating the contracted polygons to create visual polygons, and filtering the visual polygons according to one or more geometric parameters to identify salient polygons.

16 Claims, 16 Drawing Sheets

(51) Int. Cl.
    *G06T 7/155*     (2017.01)
    *G06T 11/60*     (2006.01)
    *G06F 30/10*     (2020.01)

(52) U.S. Cl.
    CPC .... *G06F 30/10* (2020.01); *G06T 2207/20081* (2013.01); *G06T 2210/04* (2013.01)

(58) Field of Classification Search
    CPC ....... G06T 2207/30244; G06T 2210/61; G06T 7/13; G06T 7/155
    See application file for complete search history.

(56) References Cited

U.S. PATENT DOCUMENTS

| | | | |
|---|---|---|---|
| 2005/0228586 A1* | 10/2005 | Yuasa | G01C 21/32 701/436 |
| 2009/0216438 A1 | 8/2009 | Shafer | |
| 2013/0222385 A1* | 8/2013 | Dorsey | G06T 11/60 345/427 |
| 2014/0035948 A1 | 2/2014 | Maurer et al. | |
| 2014/0270359 A1* | 9/2014 | Baker | G06V 20/13 382/103 |
| 2015/0128090 A1 | 5/2015 | Maurer et al. | |
| 2015/0257850 A1* | 9/2015 | Sakamoto | A61B 5/02007 600/424 |
| 2019/0197693 A1* | 6/2019 | Zagaynov | G06K 9/3275 |
| 2020/0320756 A1* | 10/2020 | Gehlaut | G06T 11/40 |

* cited by examiner

SYSTEM AND METHOD FOR TRACING POLYGONS IN DESIGN FILES

TECHNICAL FIELD

The embodiments disclosed herein relate to automated methods of editing design files, and, in particular to a system and method for tracing polygons in design files containing only line segments.

INTRODUCTION

Design files (e.g. CAD, SVG, DXF) are used to create, draft, edit, modify and optimize the design of buildings, machines, electronics, vehicles and other 3D objects in a number of industries. Design files are also used in computer animation for creating advertisement and marketing materials, and for creating artistic works and entertainment media.

Design files may use vector-based graphics or raster graphics to depict the designed objects. Design files, particularly older files, may be of varying quality. It is desirable for a design file to include polygon attributes, to define the boundary of object(s) depicted in the design file, for easier editing and modification. However, in some cases, a design file may not include polygon attributes defining the boundary of the object(s). Rather, the design file will include lines or line segments that form the object(s) boundaries. To assign polygon attributes to the objects in the design file, the lines/line segments must be connected to define polygons corresponding to the object(s) boundaries. This can be done manually, which is time consuming and introduces human error and observer bias.

In other cases, a design file may be "noisy," with incomplete polygon tracing. Automated methods of tracing and generating polygons from lines have limitations. For example, the doubly connected edge list method does not fill in small gaps in polygons leading to incomplete polygons. Morphological image processing (i.e. erosion) is computationally intensive. Parallel lines that are narrowly separated, potentially intended to be overlapping or parts of a single overly detailed diagram component, may lead to a doubly connected edge list (DCEL) creating superfluous sliver polygons not intended by the original diagram creator. Small polygons due to small inaccuracies in the drawn line segments may also be generated by the DCEL. Further, the existing methods do not integrate user input with machine learning to provide error checking and optimization of polygon tracing and generation.

Accordingly, there is a need for a self-improving polygon tracing/correction system to generate polygons from lines in design files while minimizing human error and observer bias.

SUMMARY

Provided is a method for tracing polygons in a drawing source file. The method include extracting vector imagery from the source file, creating a planar representation of the vector imagery as a plurality of lines, filtering the plurality of lines to create simplified line art, morphologically dilating the simplified line art to generate a polygonal approximation, calculating geometric difference between the source file canvas bounds and the polygonal approximation to identify contracted polygons, morphologically dilating the contracted polygons to create visual polygons, and filtering the visual polygons according to one or more geometric parameters to identify salient polygons.

The method may further include generating a composite raster representation of the salient polygons overlaid on the planar representation of the vector imagery, detecting, by a first machine learning model, candidate regions for salient polygon improvement, generating, by a second machine learning model, suggested modifications to salient polygon vertices, validating the suggested modifications, and applying the validated modifications to create improved polygons.

The method may further include storing detection training data that is generated upon validating the suggested modifications, storing modification training data that is generated upon validating the suggested modifications, updating the first machine learning model with the detection training data, and updating the second machine learning model with the modification training data.

The method may further include detecting colinear edges within each salient polygon, grouping colinear edges into sets, wherein colinear edges in a given set are located on a common line, sequentially pairing colinear edges in each set, in order of appearance on the common line, replacing each pair of colinear edges with a spanning segment, wherein the pair of colinear edges are separated by a minimum distance, and combining the spanning segments to create a simplified polygon.

The method may further include generating a composite raster representation of the simplified polygons overlaid on the planar representation of the vector imagery, detecting, by a first machine learning model, candidate regions for simplified polygon improvement, generating, by a second machine learning model, suggested modifications to simplified polygon vertices, validating the suggested modifications, and applying the validated modifications to create improved polygons.

The method may further include storing detection training data that is generated upon validating the suggested modifications, storing modification training data that is generated upon validating the suggested modifications, updating the first machine learning model with the detection training data, and updating the second machine learning model with the modification training data.

The filtering the plurality of lines may include selecting lines according to line groupings in the source file.

The filtering the plurality of lines may include excluding lines below a minimum length.

The filtering the plurality of lines may include selecting lines randomly.

The filtering the plurality of lines may include segmenting the planar representation and selecting a random subset of lines from each segment.

The morphologically dilating may employ a structuring element in the form of a circle with radius greater than zero.

The one or more geometric parameters may include size, area, compactness and proximity to neighbors.

Provided is a system for tracing polygons in a source file. The system includes a database for storing source files, wherein each source file comprises vector imagery, a processor coupled to the database, and configured to: obtain the source file canvas bounds, generate a planar representation of the source file vector imagery as a plurality of lines, filter the plurality of lines to create simplified line art, morphologically dilate the simplified line art to generate a polygonal approximation, calculate a geometric difference between the source file canvas bounds and the polygonal approximation to identify contracted polygons, morphologically dilate the contracted polygons to create visual polygons, and filter the visual polygons according to one or more geometric parameters to identify salient polygons, a memory coupled to the processor, and configured to store the planar representation, the source file canvas bounds, the simplified line art, the polygonal approximation, the contracted polygons, the visual polygons, and salient polygons.

The processor may be further configured to generate a composite raster representation of the salient polygons overlaid on the planar representation of the vector imagery, implement a first machine learning model to identify candidate regions for salient polygon improvement, implement a second machine learning model to generate suggested modifications to salient polygon vertices, receive user validation of the suggested modifications, update the first and second machine learning models based on the validated modifications, and apply the validated modifications to create improved polygons, and wherein the memory is further configured to store the composite raster representation, the candidate regions for polygon improvement, the suggested modifications, the validated modifications, the user input, and the improved polygons.

The system further includes a display for showing candidate suggested modifications to a user and an input device for entering user validation.

The processor may be further configured to detect colinear edges within each salient polygon, group colinear edges into sets, wherein colinear edges in a given set are located on a common line, sequentially pair colinear edges in each set, in order of appearance on the common line, replace each pair of colinear edges with a spanning segment, wherein the pair of colinear edges are separated by a minimum distance, and combine the spanning segments to create a simplified polygon, and wherein the memory is further configured to store the sets of colinear edges, and the simplified polygons.

The processor is further configured to generate a composite raster representation of the simplified polygons overlaid on the planar representation of the vector imagery, implement a first machine learning model to identify candidate regions for simplified polygon improvement, implement a second machine learning model to generate suggested modifications to salient polygon vertices, receive user validation of the suggested modifications, update the first and second machine learning models based on the validated modifications, and apply the validated modifications to create improved polygons, and wherein the memory is further configured to store the composite raster representation, the candidate regions for polygon improvement, the suggested modifications, the validated modifications, the user input, and the improved polygons.

The system further includes a display for showing candidate suggested modifications to a user, and an input device for entering user validation.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings.

DETAILED DESCRIPTION

Various apparatuses or processes will be described below to provide an example of each claimed embodiment. No embodiment described below limits any claimed embodiment and any claimed embodiment may cover processes or apparatuses that differ from those described below. The claimed embodiments are not limited to apparatuses or processes having all of the features of any one apparatus or process described below or to features common to multiple or all of the apparatuses described below.

One or more systems described herein may be implemented in computer programs executing on programmable computers, each comprising at least one processor, a data storage system (including volatile and non-volatile memory and/or storage elements), at least one input device, and at least one output device. For example, and without limitation, the programmable computer may be a programmable logic unit, a mainframe computer, server, and personal computer, cloud-based program or system.

Each program is preferably implemented in a high-level procedural or object oriented programming and/or scripting language to communicate with a computer system. However, the programs can be implemented in assembly or machine language, if desired. In any case, the language may be a compiled or interpreted language. Each such computer program is preferably stored on a storage media or a device readable by a general or special purpose programmable computer for configuring and operating the computer when the storage media or device is read by the computer to perform the procedures described herein.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described (in the disclosure and/or in the claims) in a sequential order, such processes, methods and algorithms may be configured to work in alternate orders. In other words, any sequence or order of steps that may be described does not necessarily indicate a requirement that the steps be performed in that order. The steps of processes described herein may be performed in any order that is practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

Figure 1A:
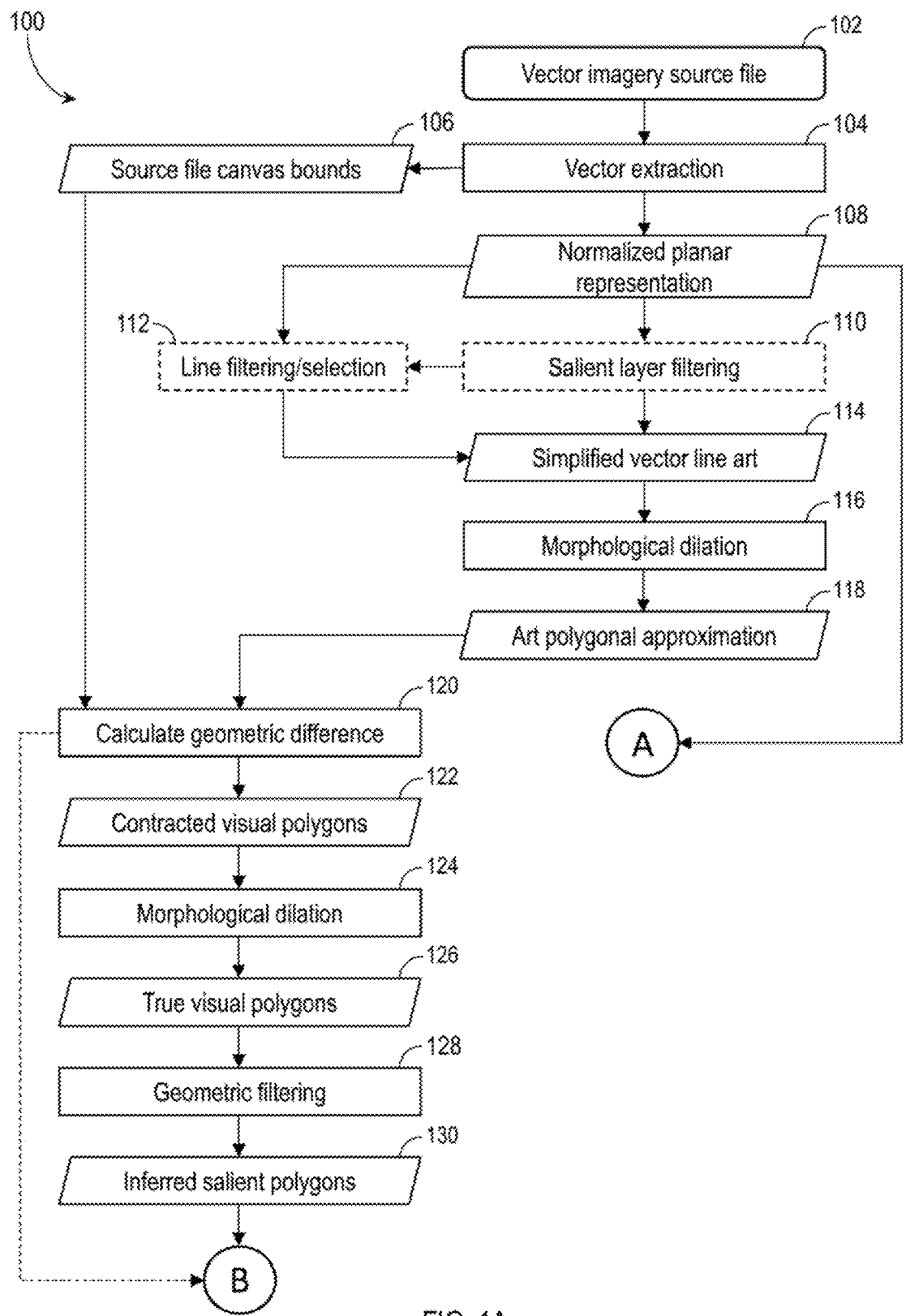
FIG. 1A is a flowchart of a method for automatically tracing polygons in a drawing source file, according to an embodiment.
Figure 2:
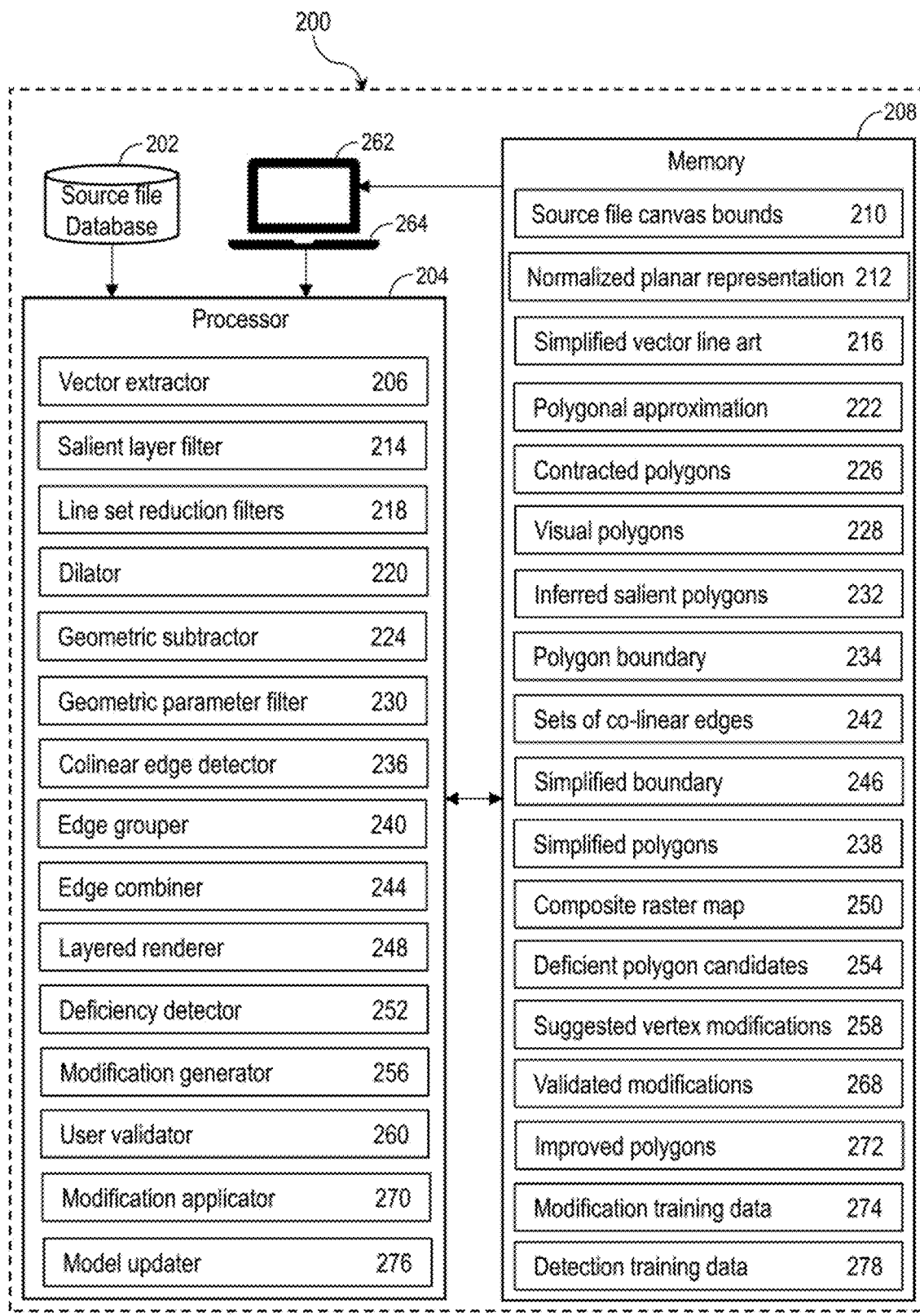
FIG. 2 is a diagram of a system for implementing the methods shown in FIGS. 1A, 1B, and 1C, according to an embodiment.

Referring to FIG. 1A illustrated therein is a flowchart of a method 100 for automatically tracing polygons in a drawing source file, in accordance with an embodiment. The method 100 may be performed by components and devices in a system, such as system 200, illustrated in FIG. 2 and described in more detail below. In the description of method 100 the elements from FIG. 2 are identified in parenthesis for reference.

Now referring to FIG. 1A, illustrated therein is a flowchart of method 100 for automatically tracing polygons in a drawing source file. At 102, a source file is accessed. The source file may be one of a plurality of source files stored in a database (202). The source file may be a CAD, SVG, DXF, or other drawing file containing vector line art. The source file typically depicts the layout of a building showing, for example, rooms and areas divided by walls. The source file may depict indoor and/or outdoor areas. The source file may include polygons defining the boundary of objects (i.e. rooms, spaces, areas) depicted in the source file. The source file may include incomplete or distorted polygons.

At 104, vector line art in the source file is extracted by a processor (204). The processor (204) includes a vector extractor (206) for creating a normalized planar representation (212) from the extracted vector line art. The normalized planar representation is a plurality of lines in a plane, where the plurality of lines correspond to the vector imagery in the source file. The vector extractor (206) also extracts the source file canvas bounds (210) (i.e. the dimensions of the source file image). At 108, the normalized planar representation (212) of the vector line art is stored in a memory (208). Concurrently, at 106, the source file canvas bounds (210) is stored in the memory (208).

Figure 3A:
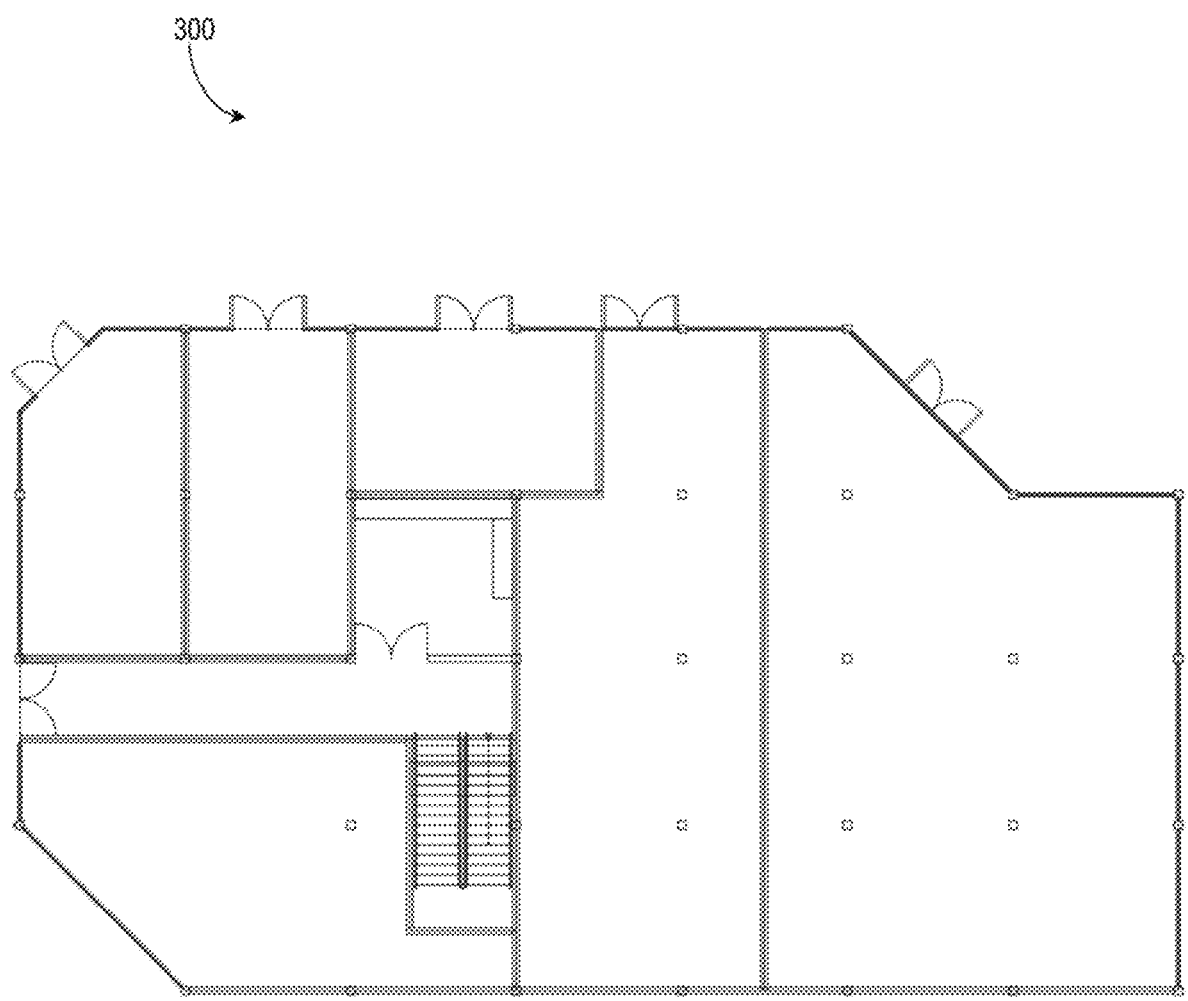
FIG. 3A is an exemplary normalized planar representation of vector imagery in a source file shown as a plurality of lines, according to an embodiment.

Referring to FIG. 3A, illustrated therein is an exemplary normalized planar representation 300 of vector imagery in a source file. The planar representation 300 may be the product of Act 104 in method 100 and may be stored in a memory at Act 108.

Referring back to FIG. 1A, the source file accessed at Act 102 may include layers or groupings of vector line art within the source file. Thus, the normalized planar representation (212) may include lines from one layer/grouping overlaid on lines from another layer/grouping. As such, identifying individual polygons using the planar representation (212) may be difficult and computationally onerous.

At 110, the planar representation (212) may be processed (204) by a salient layer filter (214) to select for a single layer/grouping of vector line art as simplified vector line art (216). If the source file contains layers/groupings, the simplified vector line art (216) is a subset of the total lines in the normalized planar representation (212) art thereby reducing the overall number of lines to consider when tracing polygons, making the process faster and less computationally intensive.

At 112, if the source file does not include layers/groupings, or if the number of lines in the simplified vector line art (216) is still onerously high, line set reduction filters (218) may be applied by the processor (204) to further reduce the number of lines in the simplified vector line art (216). The line set reduction filters (218) are configured to exclude lines, or select lines, according to pre-programmed criteria. The criteria may include: excluding lines below a minimum length; selecting lines randomly; or segmenting the planar representation and selecting a random subset of lines from each segment. At 114, the simplified vector line art is (216) is stored in the memory (208).

Figure 3B:
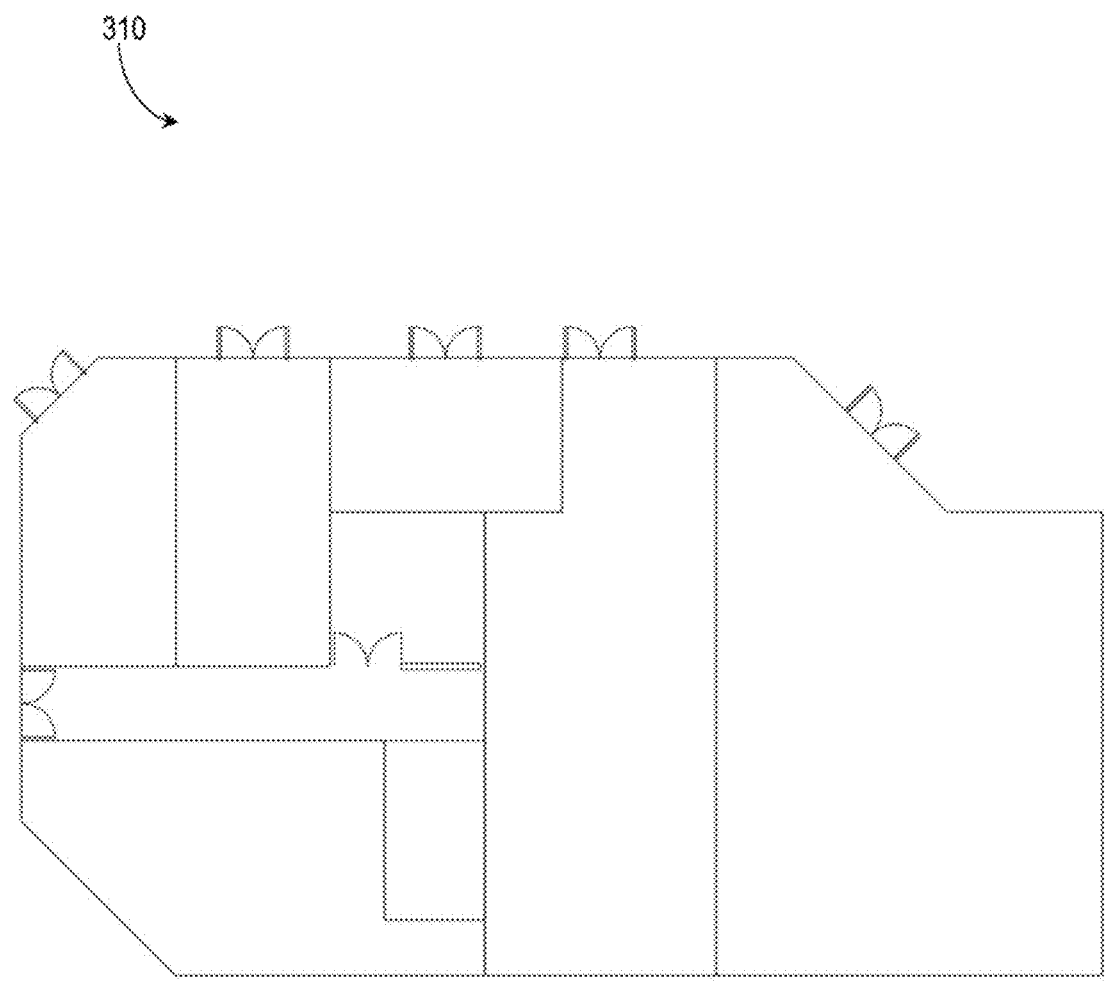
FIG. 3B is exemplary simplified vector line art after filtering of the normalized planar representation shown in FIG. 3A.

Referring to FIG. 3B, illustrated therein is an exemplary simplified vector line art 310 of the normalized planar representation 300 shown in FIG. 3A. The simplified line art 310 may be the product of Act 110 and/or Act 112 and may be stored in the memory at Act 114.

Referring back to FIG. 1A, at 116, morphological dilation, performed by a dilator (220) of the processor (204), is applied to the simplified vector line art (216). Morphological dilation is a known image processing technique to make objects generally more visible and fill in small gaps in objects. For example, thin lines will appear thicker following morphological dilation. Also, gaps between lines, will be filled in following dilation, if a structuring element of sufficient size is used. The morphological dilation is applied with a structuring element in the form of a circle with radius, $\varepsilon > 0$. The result of Act 116 is a polygonal approximation (222) of the simplified vector line art (216). At 118, the polygonal approximation (222) is stored in the memory (208).

Figure 3C:
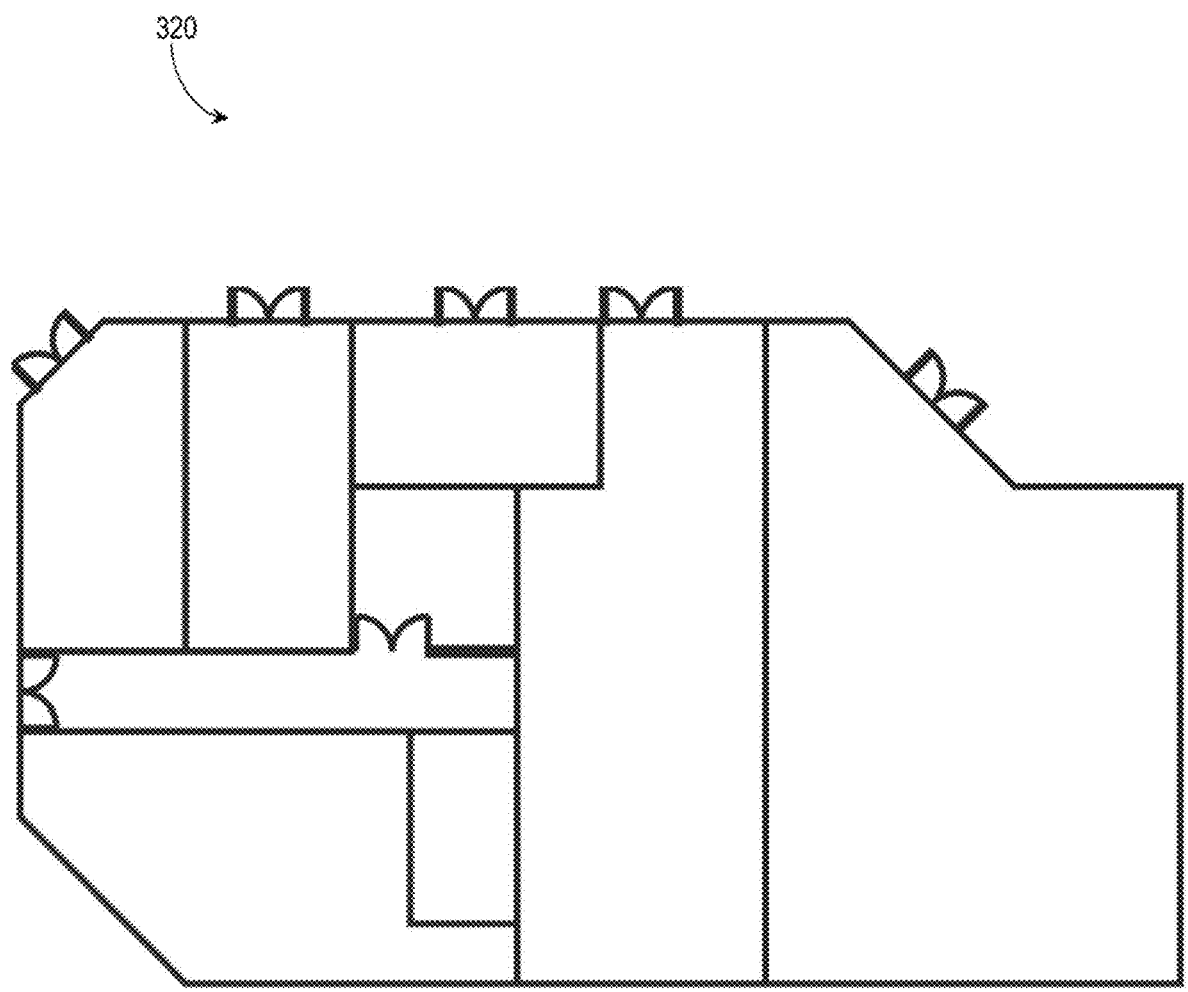
FIG. 3C shows an exemplary polygonal approximation of the simplified vector line art shown in FIG. 3B.

Referring to FIG. 3C, illustrated therein is an exemplary polygonal approximation 320 of the simplified vector line art 310 shown in FIG. 3B. The polygonal approximation 320 may be product of Act 116 and may be stored in the memory at Act 118.

Referring back to FIG. 1A, at 120, a geometric subtractor (224) of the processor (204), subtracts the polygonal approximation (222) from the source file canvas bounds (210). The source file canvas bounds (210) is treated as a single polygon and the polygonal approximation (222) is subtracted from the canvas bounds (210) leaving a set of contracted visual polygons (226) representing closed and nearly closed regions in the image, eroded by epsilon $\varepsilon$. The erosion is a result of subtraction. The subtracted polygon is an epsilon 'wider' than the polygon is, in the diagram at the component edges. At 122, the contracted visual polygons (226) are stored in the memory (208).

Figure 3D:
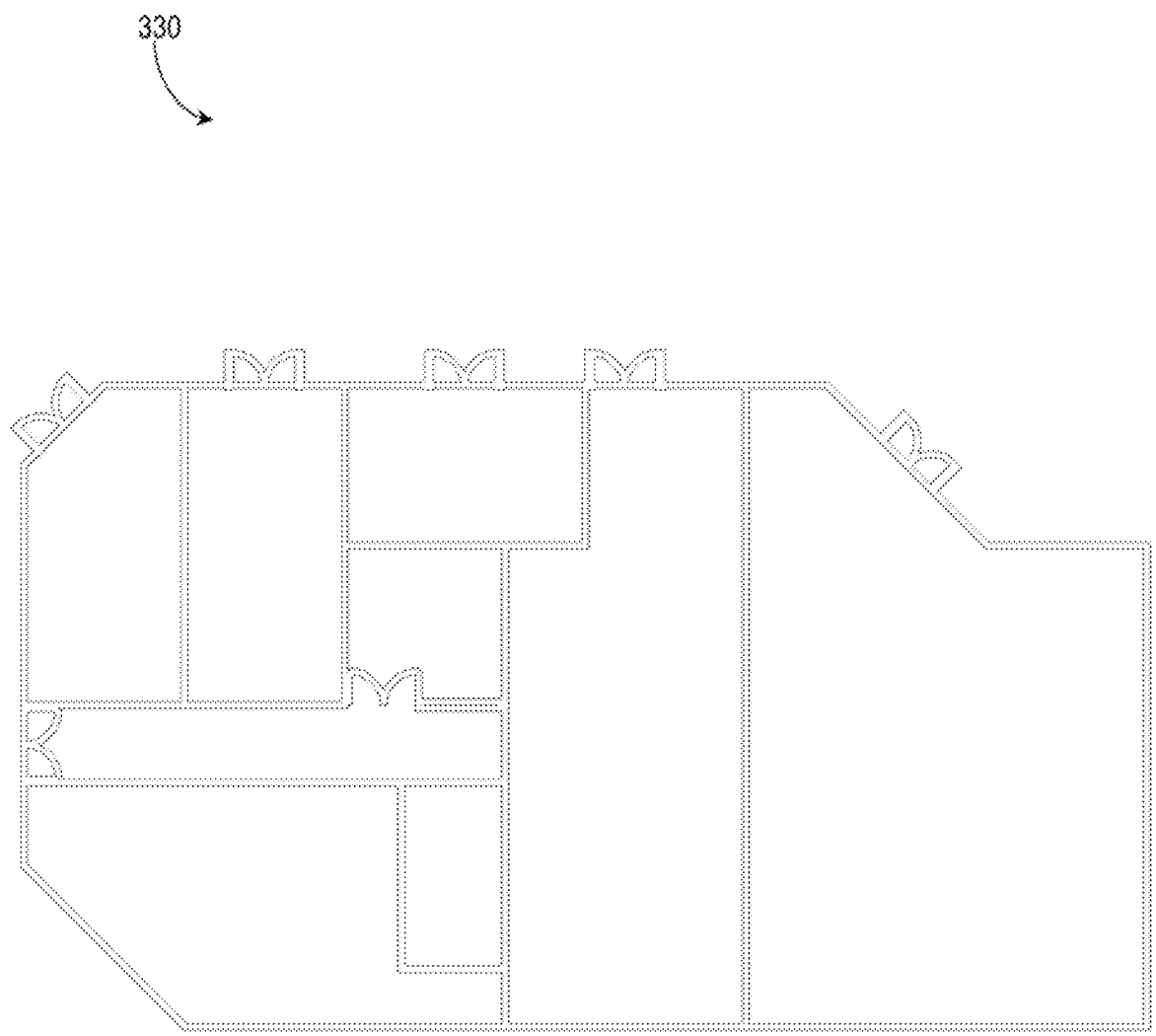
FIG. 3D shows exemplary contracted visual polygons representing the difference between source file canvas bounds and the polygonal approximation shown in FIG. 3C.

Referring to FIG. 3D, illustrated therein is exemplary contracted visual polygons 330 representing the difference between the source file canvas bounds and the polygonal approximation 320 shown in FIG. 3C. The contracted visual polygons 330 may be product of Act 120 and may be stored in the memory at Act 122.

Referring back to FIG. 1A, at 124, the dilator (220), applies morphological dilating to the contracted visual polygons (226). The morphological dilation is applied with a structuring element in the form of a circle with radius, $\varepsilon > 0$. The result of Act 124 is the creation of true visible polygons (228). The true visual polygons (228) represent fully closed regions in the image, eroded by $\varepsilon$. That is, when viewed in the plane, the true visual polygons (228) will appear to be polygonal shapes. At 126, the true visual polygons (228) are stored in the memory (208).

Figure 3E:
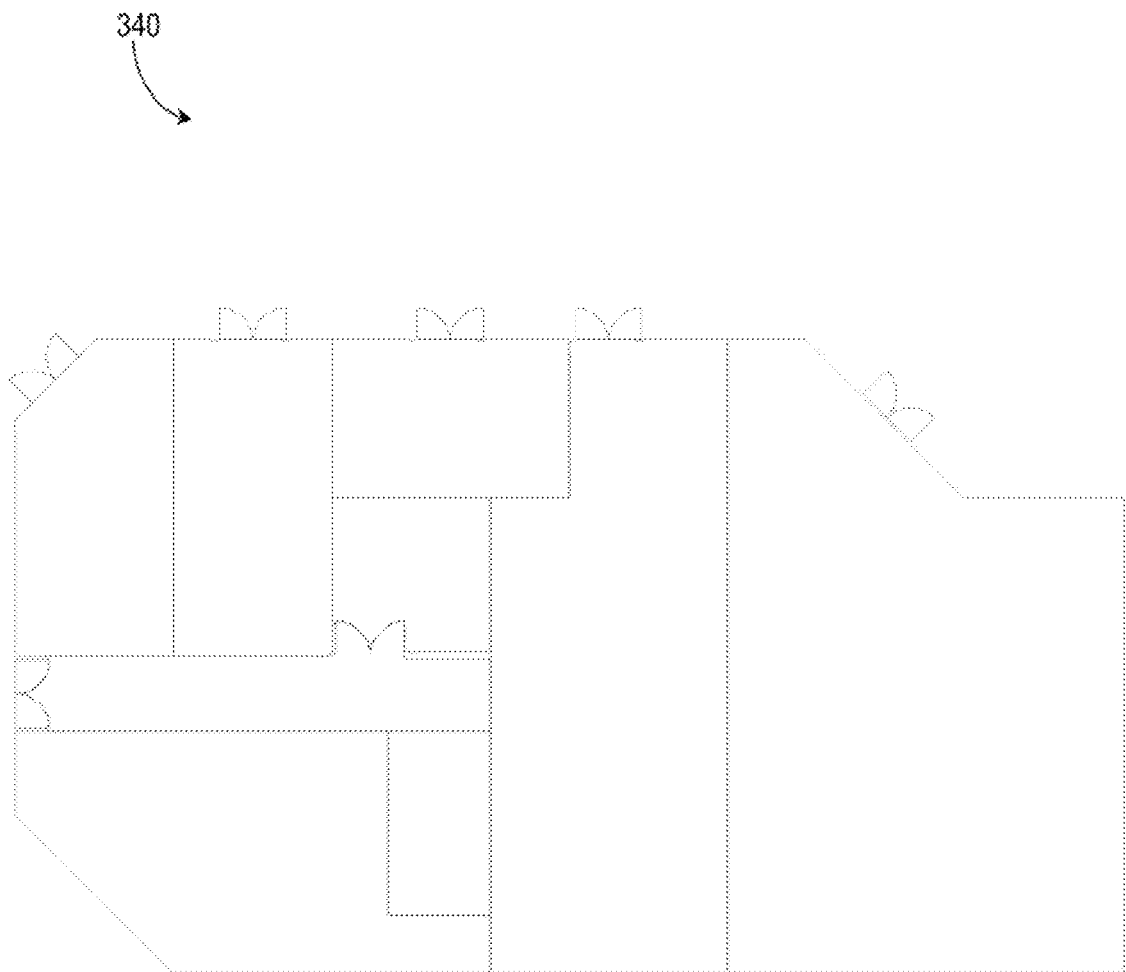
FIG. 3E shows exemplary true visual polygons created from morphological dilation of the contracted visual polygons shown in FIG. 3D.

Referring to FIG. 3E, illustrated therein are exemplary true visual polygons 340 created from morphological dilation of the contracted visual polygons 330 shown in FIG. 3D. The true visual polygons 340 may be product of Act 124 and may be stored in the memory at Act 126.

Referring back to FIG. 1A, at 128, a geometric parameter filter (230), is applied by the processor (204) to select for salient polygons (232). The geometric parameter filter (230) is configured to select inferred salient polygons (232) from the true visual polygons (228), according to pre-programmed geometric criteria. The geometric criteria may include polygon size, area, compactness or proximity to neighboring polygons. For example, true visual polygons with a size and/or area below a threshold value may be excluded. At 130, the inferred salient polygons (232) are stored in the memory (208).

Figure 3F:
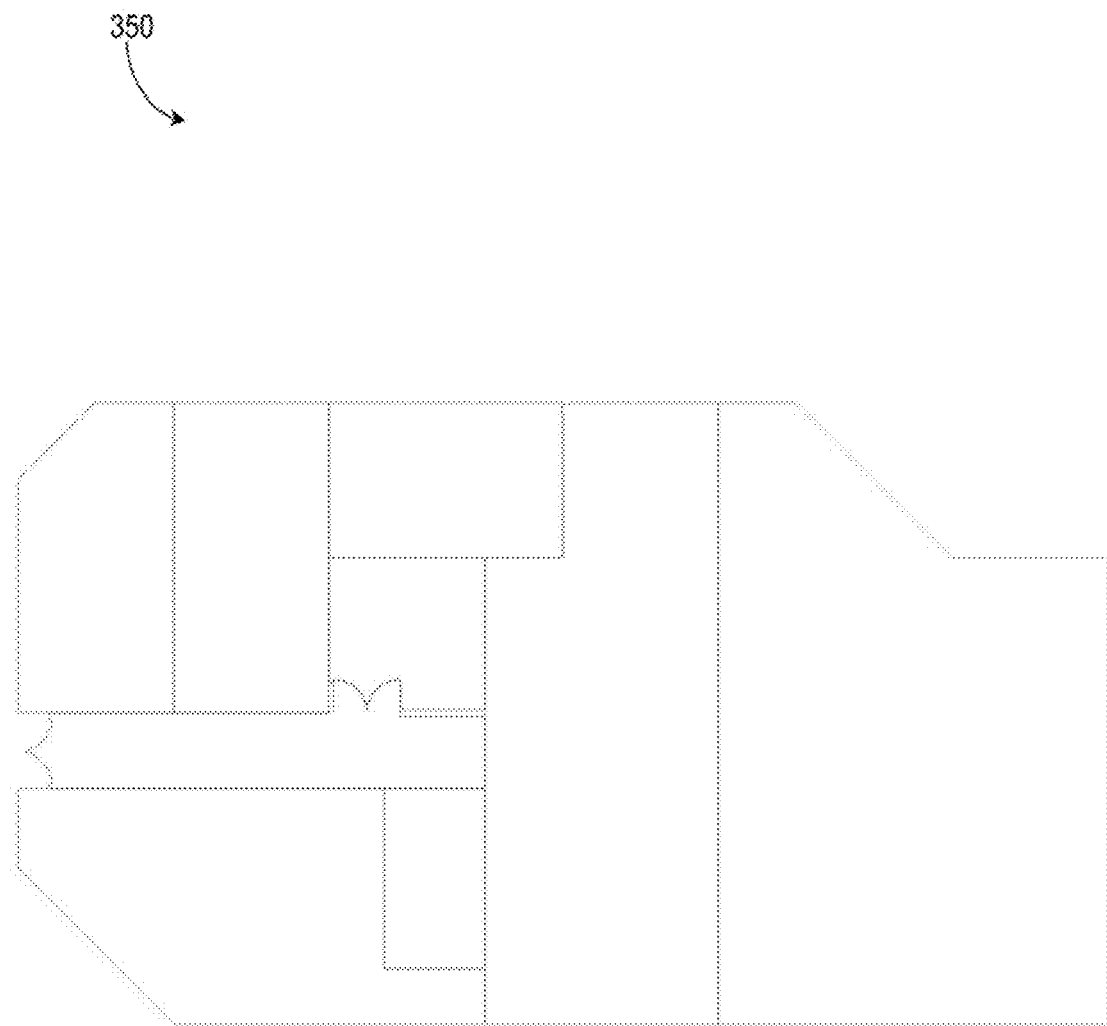
FIG. 3F shows exemplary inferred salient polygons from the true visual polygons shown in FIG. 3E.

Referring to FIG. 3F, illustrated therein are exemplary inferred salient polygons 350 from the true visual polygons 340 shown in FIG. 3E. The inferred salient polygons 350 may be product of Act 128 and may be stored in the memory at Act 130.

Referring back to FIG. 1A, method 100 is an automated method for implementation by a computer system, thereby removing human error and bias when tracing polygon boundaries from the vector imagery in the source file. However, the salient inferred polygons (232) returned by method 100 may contain discontinuities in polygon boundaries. Thus, it is desirable to have a method to automatically identify and repair discontinuities in polygons.

Figure 1B:
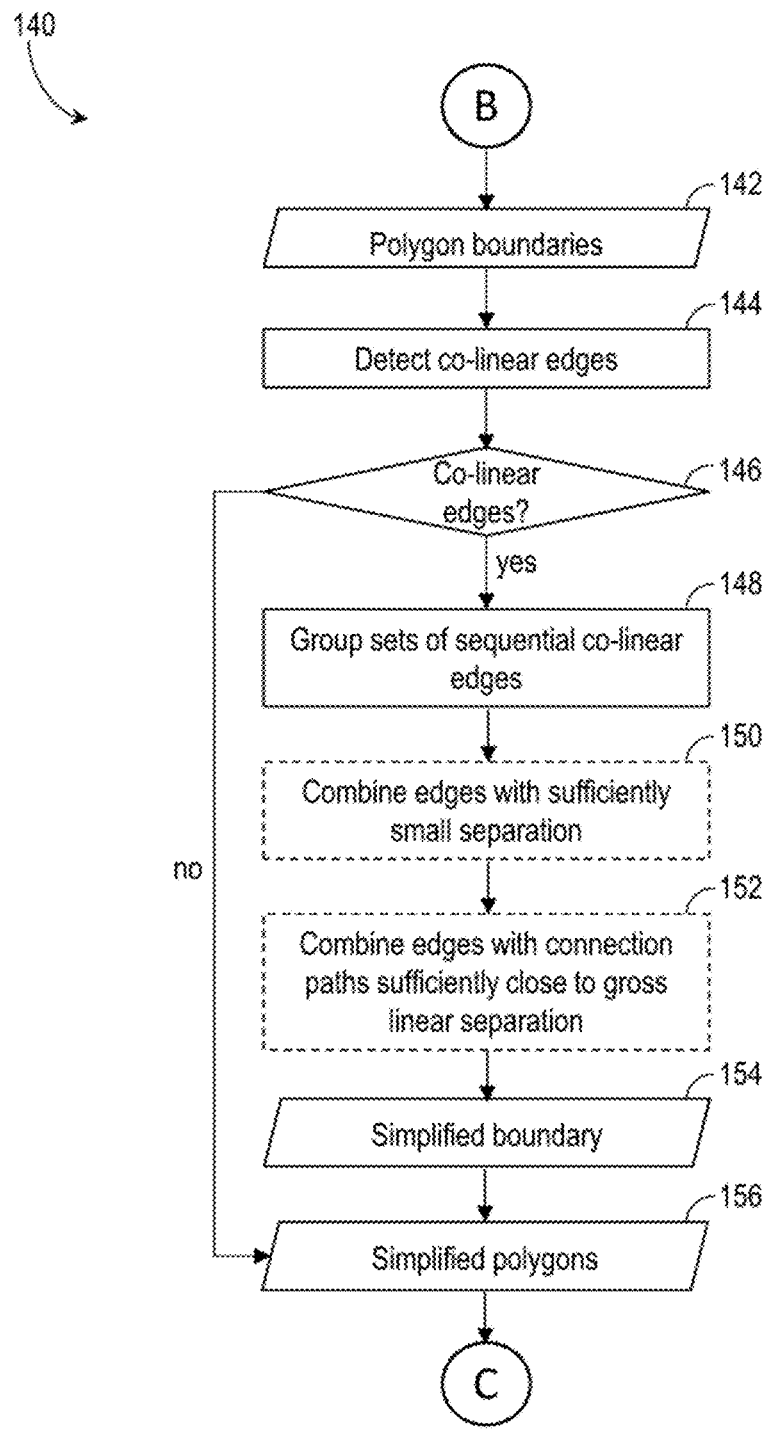
FIG. 1B is a flowchart of a method for identifying and repairing discontinuities in polygons, according to an embodiment.

Now referring to FIG. 1B, illustrated therein is a flowchart of a method 140 for identifying and repairing discontinuities in polygons, in accordance with an embodiment. Method 140 may be a continuation of method 100 at point B. The method 140 is performed once for each inferred salient polygon (232) stored in the memory (208). The method 140 may be performed by components and devices in a system, such as system 200, illustrated in FIG. 2 and described in more detail below. In the description of method 140 the elements from FIG. 2 are identified in parenthesis for reference.

At 142, the polygon boundary (234) of an inferred salient polygon (232) stored in the memory (208) is retrieved.

At 144, the processor (204) applies a colinear edge detector (236) to detect the presence of colinear edges within each polygon boundary (234). Colinear edges are those edges within a given polygon boundary that are on a common line. Colinear edges are indicative of discontinuities (gaps) in polygons.

At 146, if there are no colinear edges within a polygon boundary (234), the corresponding inferred salient polygon (232) is deemed to be completely traced (i.e. the polygon contains no discontinuities). In such case, the method 140 progresses to Act 156 and the inferred salient polygon (232) is stored in the memory (208) as a simplified polygon (238).

At 146, if colinear edges are detected within a polygon boundary (234), the method 140 progresses to Act 148.

Figure 3G:
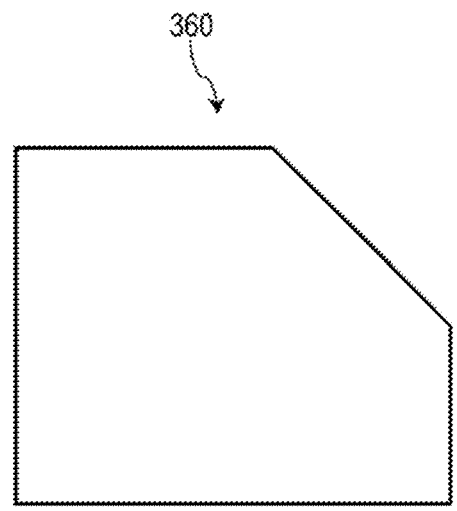
FIG. 3G shows exemplary inferred salient polygon boundaries with discontinuities and without discontinuities.
Figure 3G:
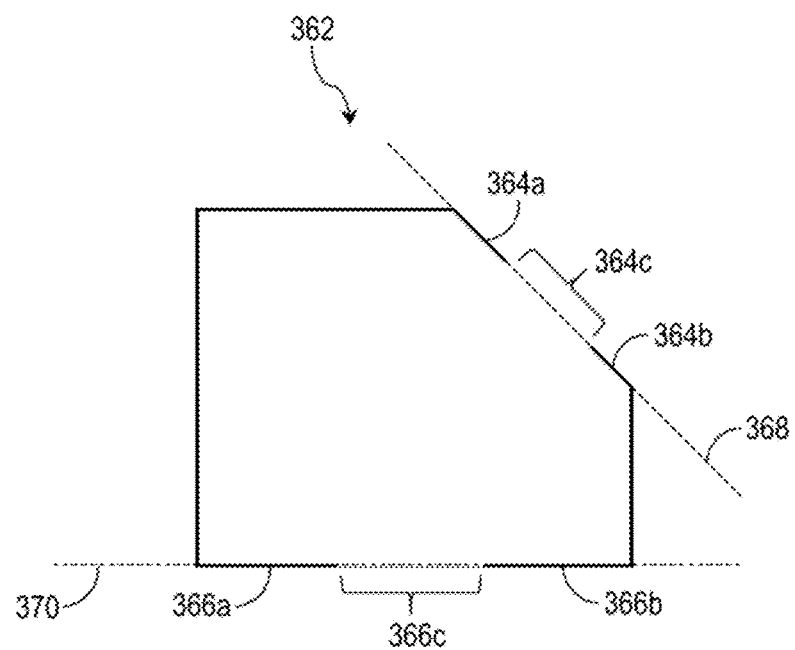

Referring to FIG. 3G, illustrated therein are two exemplary inferred salient polygons 360 and 362. The polygons 360, 362 may be traced by performance of method 100 and stored in the memory (208). The boundaries of polygon 360 do not contain any colinear edges nor gaps in the boundary. As such, when the polygon 360 is encountered at Act 146 of method 140, the polygon 360 would be deemed a simplified polygon and method 140 would progress to Act 156.

Polygon 362 includes colinear edges 364a, 364b located on common line 368 and separated by a gap 364c. polygon 362 includes colinear edges 366a, 366b located on common line 370 separated by a gap 366c. Thus, when polygon 362 is encountered at Act 146, the method 140 proceeds to Act 148.

Referring back to FIG. 1B, at Act 148, an edge grouper (240) of the processor (204) groups sets of colinear edges (242) within each polygon boundary (234). For example, with reference to polygon 362 in FIG. 3G, colinear edges 364a and 364b are grouped in a first set, and colinear edges 366a and 366b are grouped in a second set. Each set of colinear edges (242) are stored in the memory (208).

At 150, an edge combiner (244) of the processor (204) combines edges within each set of colinear edges to fill in the gaps between colinear edges in that set. The colinear edges within a set are considered in pairs for combining based on the order of appearance on the common line. If the pair of colinear edges are separated by a gap having a minimum distance on the common line, the pair of edges and intervening gap are removed from the polygon boundary and replaced by a single spanning segment on the common line. Act 150 is performed for each set of colinear edges within a polygon boundary. If all gaps in the polygon boundary are filled at Act 150, the method 140 proceeds to Act 154. If gaps remain, the method 140 proceeds to Act 152.

Figure 3H:
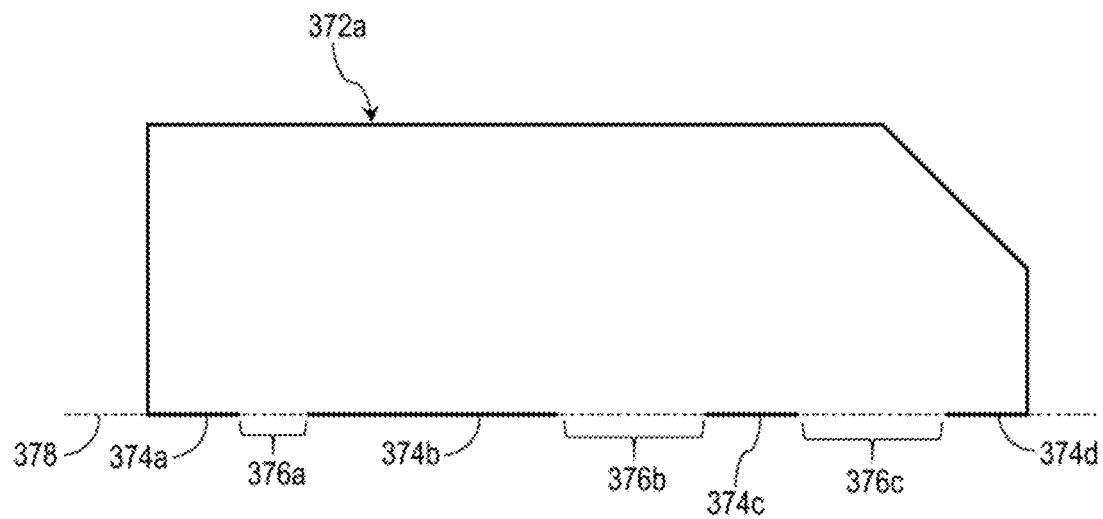
FIG. 3H shows an exemplary combining of colinear edges as performed in the method of FIG. 1B.
Figure 3H:
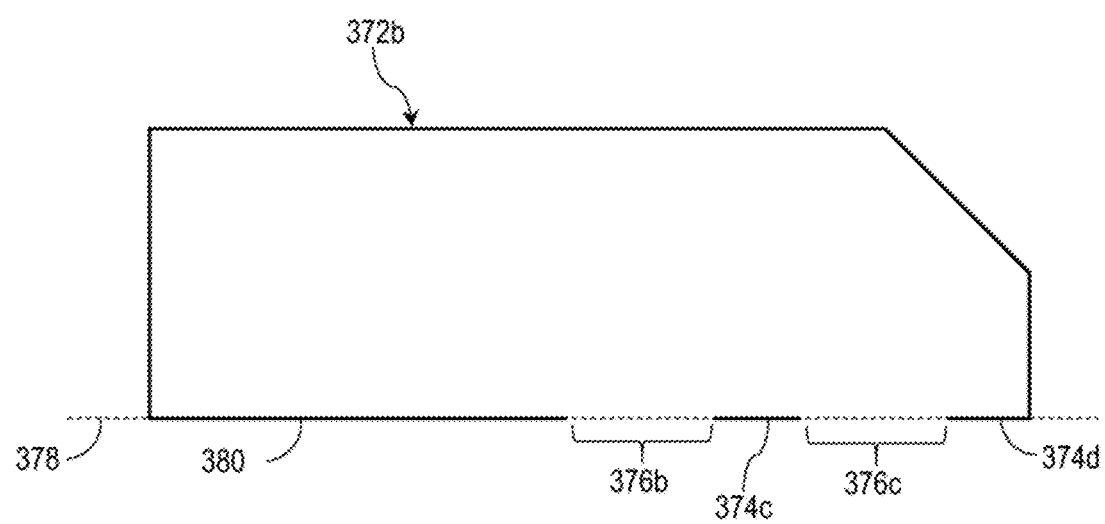

Referring to FIG. 3H, illustrated therein is an exemplary combining of edges according to Act 150 of method 140. A polygon 372 includes a set of colinear edges 374a, 374b, 374c and 374d on a common line 378. The colinear edges 374a, 374b, 374c and 374d are considered in pairs for combining (i.e. 374a and 374b; 374b and 374c; 374c and 374d). The colinear edges 374a, 374b, 374c and 374d are separated by gaps 376a, 376b and 376c. Gap 376a is less than or equal to the minimum distance. Thus, colinear edges 374a, 374b and gap 376a are replaced by a single spanning segment 380 on common line 378 as shown in polygon 372b.

Referring back to FIG. 1B, at 152, where a colinear edges pair is separated by a gap that is greater than the minimum distance (i.e. cannot be combined at Act 150), the colinear edge pair is considered for forming a chain of colinear edges. The chain of colinear edges includes the initial colinear edge pair and at least one adjacent colinear edge (if existing). If the total length of the connecting chain is less or equal than the gross separation the chain is colinear. Chain length is less or equal to a tunable multiple D of the gross separation such that $1<D<\infty$. In a particular case, the tunable multiple is less than 2. In a particular case, D is equal to $\pi/2$, and the chain is shorter than the circumference of a half circle bridging the colinear edge pair. Act 152 is performed for each set of colinear edges within a polygon boundary.

Figure 3I:
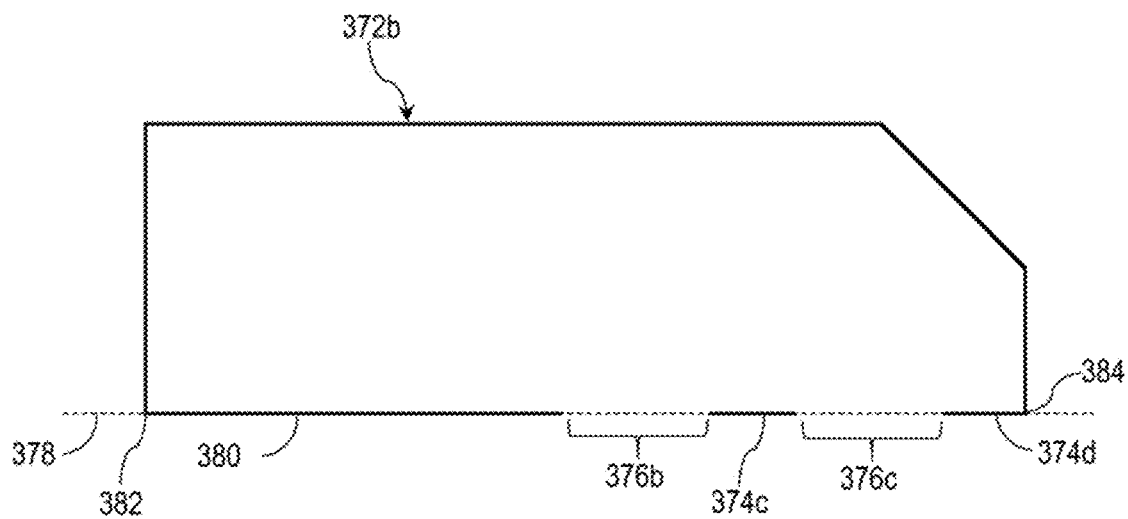
FIG. 3I shows another exemplary combining of colinear edges as performed in the method of FIG. 1B.
Figure 3I:
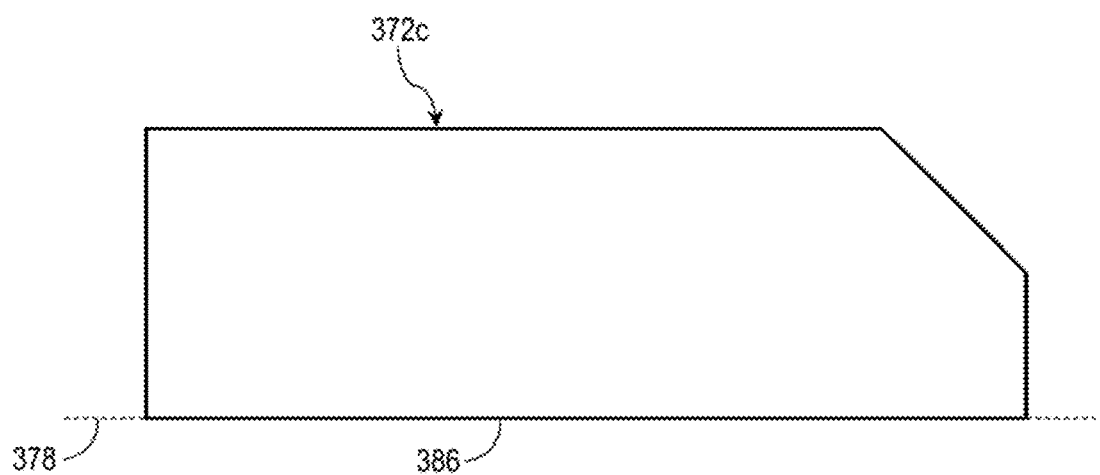

Referring to FIG. 3I, illustrated therein is an exemplary combining of colinear edges according to Act 152 of method 140. Polygon 372b includes a set of colinear edges 380, 374c and 374d on common line 378. The colinear edges 380, 374c and 374d are separated by gaps 376b, 376c. The gaps 376b, 376c are both greater than the minimum distance. Thus, colinear edge pairs (380, 364c) and (374c, 374d) cannot be combined at Act 150. A chain of colinear edges is formed including edges 380, 374c, 374d and the intervening gaps 376b, 376c. If the total distance of gaps 376b and 376c are less than the gross linear separation between edge 380 and 374d (i.e. the gross linear separation is the distance between points 382 and 384), then edges 380, 374b, 374c and gaps 376b, 376c are replaced by a single spanning segment 386 on common line 378 as shown in polygon 372c.

Referring back to FIG. 1B, at 154, each set of combined colinear edges are stored in the memory (208) as a simplified polygon boundary (246). At 156, simplified polygons (238) composed of the simplified polygon boundaries (246) are stored in the memory (208).

Method 140 is an automated method for implementation by a computer system, thereby removing human error and bias when identifying and repairing discontinuities in polygons. Even so, the repair of polygons may be incomplete or incorrect based on the configuration of the system implementing method 140. As such, it is desirable to have a method for improving polygon repair by leveraging machine learning combined with user input.

Figure 1C:
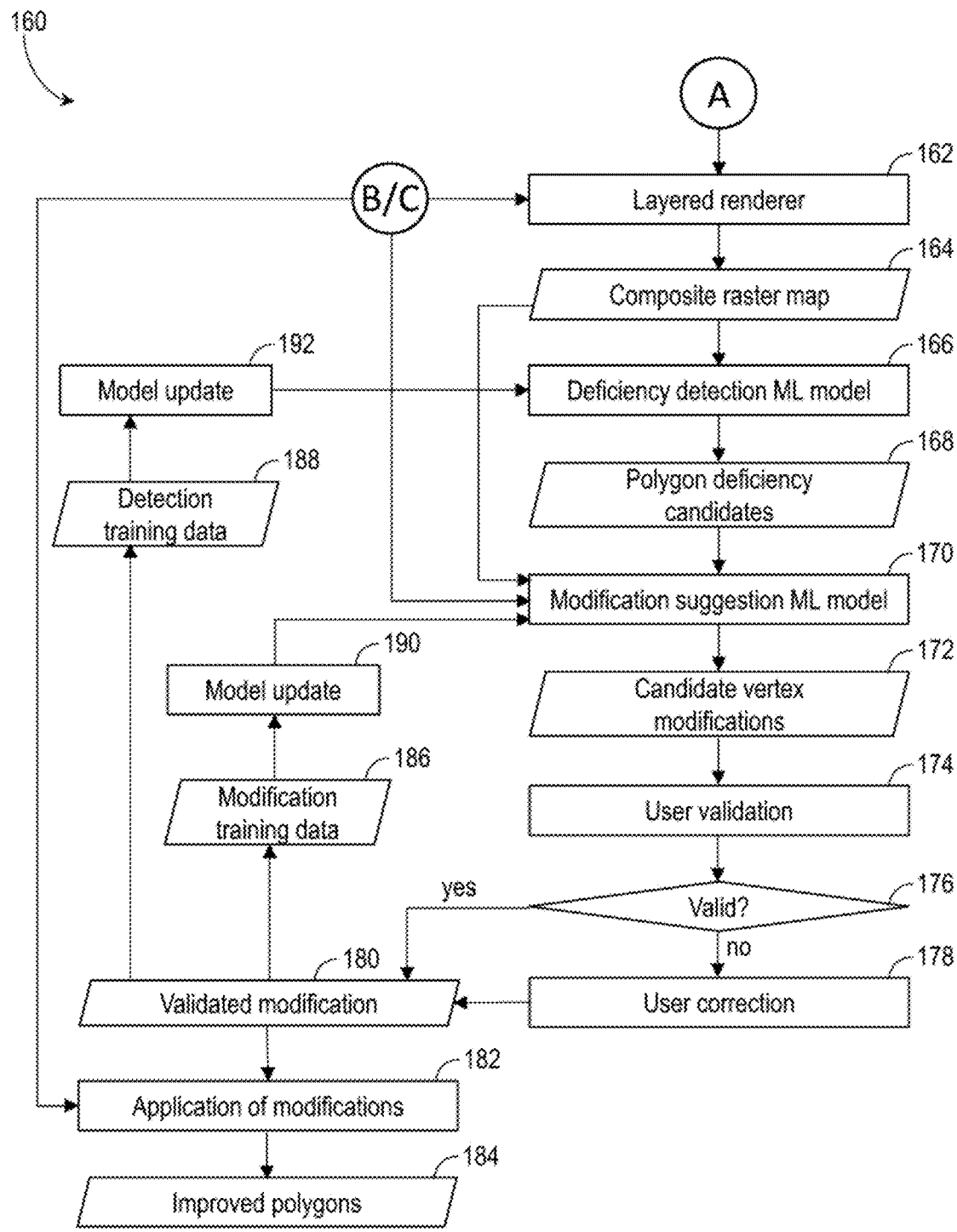
FIG. 1C is a flowchart of a method for improving polygon repair by machine learning, according to an embodiment.

Now referring to FIG. 1C, illustrated therein is a flowchart of a method 160 for improving polygon repair by machine learning augmented by user correction, in accordance with an embodiment. Method 160 may be a continuation of method 100 from Point A and Point B. The method 160 may be a continuation of method 140 from Point C. The method 160 may be performed by components and devices in a system, such as system 200, illustrated in FIG. 2 and described in more detail below. In the description of method 160 the elements from FIG. 2 are identified in parenthesis for reference.

At 162, a layered renderer (248) of the processor (204) generates a composite raster map (250) by overlaying either the inferred salient polygons (232) or the simplified polygons (238) onto the normalized planar representation (212).

At 164, the composite raster map (250) is stored in the memory (208).

At 166, a deficiency detector (252) of the processor (204) identifies deficient polygon candidates (254). The deficiency detector (252) applies a machine learning model to identify the deficient polygon candidates. The machine learning model may be a deep convolutional neural network. The machine learning model is configured to detect deficiencies in polygons according to a training dataset of accepted polygons as validated by a user. The criteria for identifying deficient polygons includes a mixture of heuristic rules based on domain knowledge. For example, polygons should not include 'whisker' like regions as they are likely to be erroneously included between wall void regions, and 'good' polygons should be reasonably compact. Further, identifying deficient polygons may be performed by machine learning based suggestions trained on data and usage.

At 168, deficient polygon candidates (254) are stored in the memory (208).

Figure 4A:
FIG. 4A shows exemplary deficient polygon candidates, according to an embodiment.

Referring to FIG. 4A, illustrated therein are exemplary deficient polygon candidates 400. The deficient polygon candidates 400 may be identified at Act 166 and may be stored in the memory at Act 168.

At 170, the deficient polygon candidates (254), the composite raster map (250) and salient inferred polygons (232) or simplified polygons (238) are fed to a modification generator (256) of the processor (204). The modification generator (256) applies a machine learning model to suggest vertex modifications (258) to the deficient polygon candidates (254). The modification generator (256) is configured to suggest vertex modifications that will change deficient polygon candidates. The modification generator (256) is related to the process in 64, for heuristic rules. The method may have a suggestion for modifying the vertex set generated algorithmically. Conversely for trained network detected deficiencies the suggested changes may be more dependent on a machine learning model that has been trained on how humans correct such detections.

At 172, the suggested vertex modifications (258) are stored in the memory (208).

Figure 4B:
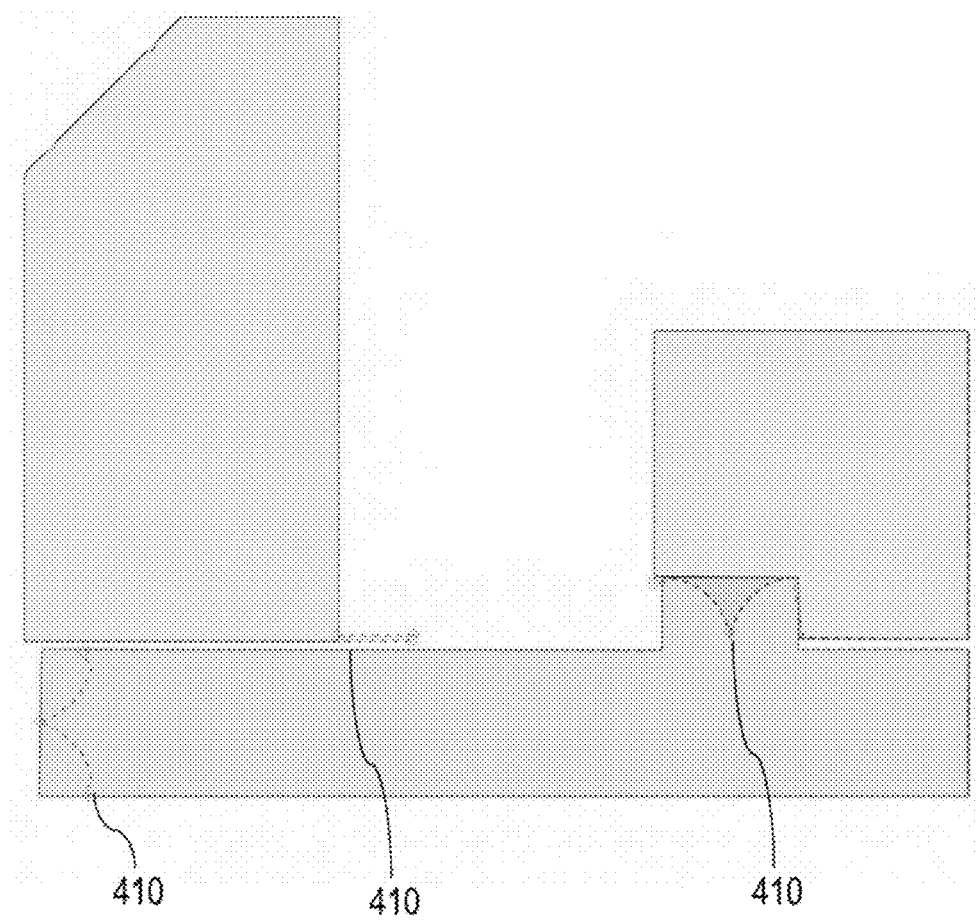
FIG. 4B shows exemplary suggested vertex modification, according to an embodiment.

Referring to FIG. 4B, illustrated therein are exemplary suggested vertex modifications 410 to the deficient polygon candidates 400 shown in FIG. 4A. The suggested vertex modifications 410 may be generated at Act 170 and stored in the memory at Act 172.

Referring back to FIG. 1C, at 174 a user validator (260) presents the suggested vertex modifications (258) to a user (i.e. a human expert) for validation. The suggested vertex modifications (258) may be presented via a display (262) for viewing by the user. The suggested vertex modifications (258) may be compared against the vector imagery in the original source file to check polygon fidelity.

At Act 176, if the user validates the suggested vertex modification (258), the method 160 proceeds to Act 180. If the user rejects the suggested vertex modification (258), the method 160 proceeds to Act 178.

At 178, the user may input a correction to the suggested vertex modifications (258) via an input device 264. If a change is determined to be required by the human, the correction is one or more modified/new vertices in the polygon being corrected. If the human determines no change is needed, the modification would be treated as a false positive and via further training including this case, be more likely to be ignored by the model.

Figure 4C:
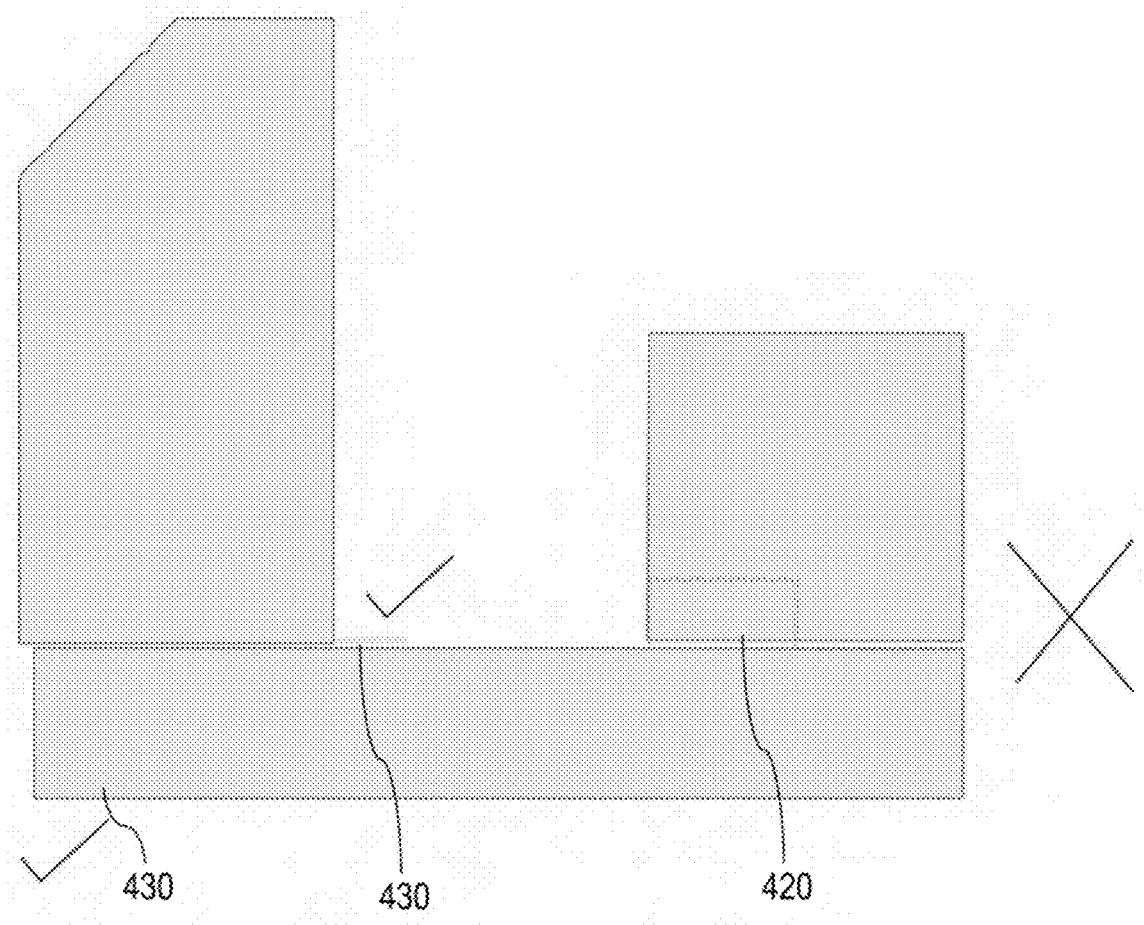
FIG. 4C shows exemplary user corrections of suggested vertex modifications, according to an embodiment.

Referring to FIG. 4C, illustrated therein are exemplary rejected vertex modifications 420 and user corrections 430.

Referring back to FIG. 1C, at 180, user validated suggested vertex modifications (258) and user corrections to suggested vertex modifications (258) are stored in the memory (208) as validated modifications (268).

At 182, a modification applicator (270) applies the validated modifications (268) to the inferred salient polygons (232)/simplified polygons (238) to create improved polygons (272).

At 184, the improved polygons (272) are stored in the memory (208). The improved polygons (272) may then be accessed to create a new design file or update the original source file.

At 186, modification training data (274) from the validated modifications (268) are stored in the memory (208). The modification training data (274) includes, for example, polygons where a suggested vertex modification (258) was validated or rejected and user corrections to suggested vertex modifications (258). At 188, detection training data (278) from the validated modifications (268) are stored in the memory (208). The detection training data (278) includes, for example polygons where a suggested vertex modification (258) was validated or rejected and user corrections to suggested vertex modifications (258). Acts 186 and 188 may be performed concurrently with each other and Act 182.

At 190, a model updater (276) adds the modification training data (274) to the machine learning model implemented by the modification generator (256). At 192, the model updater (276) adds the detection training data (278) to the machine learning model implemented by the deficiency detector (252). Acts 190 and 192 may be performed concurrently.

The method 160 may conclude at Act 184 after a single iteration. Alternatively, the method 160, may be implemented in a loop wherein the validated modifications (268) are used to update the deficiency detector (252) and the modification generator (256) for subsequent iterations of the method 160. As such, the method 160 is a self-improving method to increase the fidelity of improved polygons (272) based on the validated modifications (268) from earlier iterations. Further, the method 160 may also incrementally improve the machine learning models themselves for future use with different source files.

Now referring to FIG. 2, illustrated therein is a diagram of a system 200 for implementing methods 100, 140 and 160, in accordance with an embodiment. The system 200 includes a processor 204. The processor 204 may execute applications, computer readable instructions or programs. Applications may correspond with software modules comprising computer executable instructions to perform processing for the acts of methods 100, 140 and 160 described above. For example, the processor 204 may execute the vector extractor 206, the salient layer filter 214, the line set reduction filters 218, the dilator 220, the geometric subtractor 224, the geometric parameter filter 230, the colinear edge detector 236, the edge grouper 240, the edge combiner 244, the layered renderer 248, the deficiency detector 252, the modification generator 256, the user validator 260, the modification applicator 270 and the model updater 276 to perform respective their functions described above.

The system 200, includes a memory 208 coupled to the processor 204. The memory 208 may be random access memory (RAM). The memory 208 includes a plurality of memory units. The system 200 includes a source file database coupled to the processor 204. The source file database 204 stores a plurality of design source files.

The processor 204, the memory 208 and source file database 202 may be located on a server computer, desktop computer or laptop computer. The processor 204, the memory 208 and source file database 202 may be located on distinct servers.

The system 200 may include a display 262 coupled to the memory 208. The system 200 may include an input device 264 coupled to the processor 204.

While the above description provides examples of one or more apparatus, methods, or systems, it will be appreciated that other apparatus, methods, or systems may be within the scope of the claims as interpreted by one of skill in the art.

The invention claimed is:

1. A method for tracing polygons in a source file containing vector line art, the method comprising:
   extracting the vector line art from the source file;
   creating a planar representation of the vector line art as a plurality of lines;
   filtering the plurality of lines by salient layer filtering or line set reduction filtering to create simplified line art having fewer lines than the planar representation of the vector line art;
   morphologically dilating the simplified line art to generate a polygonal approximation;
   calculating geometric difference between the source file canvas bounds and the polygonal approximation to identify contracted polygons;
   morphologically dilating the contracted polygons to create visual polygons;
   filtering the visual polygons according to one or more geometric parameters to identify salient polygons;
   detecting colinear edges within each salient polygon;
   grouping colinear edges into sets, wherein colinear edges in a given set are located on a common line;
   sequentially pairing colinear edges in each set, in order of appearance on the common line;
   replacing each pair of colinear edges with a spanning segment, wherein the pair of colinear edges are separated by a minimum distance; and
   combining the spanning segments to create a simplified polygon.

2. The method of claim 1, further comprising:
   generating a composite raster representation of the salient polygons overlaid on the planar representation of the vector line art;
   detecting, by a first machine learning model, candidate regions for salient polygon improvement;
   generating, by a second machine learning model, suggested modifications to salient polygon vertices;
   validating the suggested modifications; and
   applying the validated modifications to create improved polygons.

3. The method of claim 2, further comprising:
   storing detection training data that is generated upon validating the suggested modifications;
   storing modification training data that is generated upon validating the suggested modifications;
   updating the first machine learning model with the detection training data; and
   updating the second machine learning model with the modification training data.

4. The method of claim 1, further comprising:
   generating a composite raster representation of the simplified polygons overlaid on the planar representation of the vector line art;
   detecting, by a first machine learning model, candidate regions for simplified polygon improvement;
   generating, by a second machine learning model, suggested modifications to simplified polygon vertices;
   validating the suggested modifications; and
   applying the validated modifications to create improved polygons.

5. The method of claim 4, further comprising:
   storing detection training data that is generated upon validating the suggested modifications;
   storing modification training data that is generated upon validating the suggested modifications;
   updating the first machine learning model with the detection training data; and
   updating the second machine learning model with the modification training data.

6. The method of claim 1, wherein filtering the plurality of lines comprises selecting lines according to line groupings in the source file.

7. The method of claim 1, wherein filtering the plurality of lines comprises excluding lines below a minimum length.

8. The method of claim 1, wherein filtering the plurality of lines comprises selecting lines randomly.

9. The method of claim 1, wherein filtering the plurality of lines comprises segmenting the planar representation and selecting a random subset of lines from each segment.

10. The method of claim 1, wherein morphologically dilating employs a structuring element in the form of a circle with radius greater than zero.

11. The method of claim 1, wherein the one or more geometric parameters comprise size, area, compactness and proximity to neighbors.

12. A system for tracing polygons in a source file containing vector line art, the system comprising:
   a database for storing the source;
   a processor coupled to the database, and configured to:
      obtain the source file canvas bounds;
      extract the vector line art from the source file;

generate a planar representation of the vector line art as a plurality of lines;

filter the plurality of lines by salient layer filtering or line set reduction filtering to create simplified line art having fewer lines than the planar representation of the vector line art;

morphologically dilate the simplified line art to generate a polygonal approximation;

calculate a geometric difference between the source file canvas bounds and the polygonal approximation to identify contracted polygons;

morphologically dilate the contracted polygons to create visual polygons;

filter the visual polygons according to one or more geometric parameters to identify salient polygons detect colinear edges within each salient polygon;

group colinear edges into sets, wherein colinear edges in a given set are located on a common line;

sequentially pair colinear edges in each set, in order of appearance on the common line;

replace each pair of colinear edges with a spanning segment, wherein the pair of colinear edges are separated by a minimum distance; and combine the spanning segments to create a simplified polygon;

a memory coupled to the processor, and configured to store:

the planar representation, the source file canvas bounds, the simplified line art, the polygonal approximation, the contracted polygons, the visual polygons, the salient polygons, the sets of colinear edges, and the simplified polygons.

13. The system of claim 12, wherein the processor is further configured to:

generate a composite raster representation of the salient polygons overlaid on the planar representation of the vector line art;

implement a first machine learning model to identify candidate regions for salient polygon improvement;

implement a second machine learning model to generate suggested modifications to salient polygon vertices;

receive user validation of the suggested modifications;

update the first and second machine learning models based on the validated modifications; and apply the validated modifications to create improved polygons;

and wherein the memory is further configured to store:

the composite raster representation, the candidate regions for polygon improvement, the suggested modifications, the validated modifications, the user input, and the improved polygons.

14. The system of claim 13, further comprising:

a display for showing candidate suggested modifications to a user; and an input device for entering user validation.

15. The system of claim 12, wherein the processor is further configured to:

generate a composite raster representation of the simplified polygons overlaid on the planar representation of the vector line art;

implement a first machine learning model to identify candidate regions for simplified polygon improvement;

implement a second machine learning model to generate suggested modifications to salient polygon vertices;

receive user validation of the suggested modifications;

update the first and second machine learning models based on the validated modifications; and apply the validated modifications to create improved polygons;

and wherein the memory is further configured to store:

the composite raster representation, the candidate regions for polygon improvement, the suggested modifications, the validated modifications, the user input, and the improved polygons.

16. The system of claim 15, further comprising:

a display for showing candidate suggested modifications to a user; and an input device for entering user validation.

* * * * *